United States Patent
Kuraguchi et al.

(10) Patent No.: US 11,189,718 B2
(45) Date of Patent: Nov. 30, 2021

(54) SEMICONDUCTOR DEVICE WITH SUPPRESSED SELF-TURN-ON

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Masahiko Kuraguchi, Yokohama (JP); Yosuke Kajiwara, Yokohama (JP); Aya Shindome, Yokohama (JP); Hiroshi Ono, Setagaya (JP); Daimotsu Kato, Kawasaki (JP); Akira Mukai, Kawasaki (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 86 days.

(21) Appl. No.: 16/799,901

(22) Filed: Feb. 25, 2020

(65) Prior Publication Data

US 2020/0373422 A1 Nov. 26, 2020

(30) Foreign Application Priority Data

May 22, 2019 (JP) .............................. JP2019-095931

(51) Int. Cl.
*H01L 29/66* (2006.01)
*H01L 29/778* (2006.01)
(Continued)

(52) U.S. Cl.
CPC ...... *H01L 29/7786* (2013.01); *H01L 29/2003* (2013.01); *H01L 29/205* (2013.01);
(Continued)

(58) Field of Classification Search
CPC ............. H01L 29/7786; H01L 29/2003; H01L 29/205; H01L 29/4236; H01L 29/42364;
(Continued)

(56) References Cited

U.S. PATENT DOCUMENTS 8,283,699 B2 10/2012 Wu
9,461,122 B2 10/2016 Kuraguchi et al.
(Continued)

FOREIGN PATENT DOCUMENTS

JP 2008-124440 A 5/2008
JP 2012-231107 A 11/2012
(Continued)

*Primary Examiner* — Tan N Tran
(74) *Attorney, Agent, or Firm* — Oblon, McClelland, Maier & Neustadt, L.L.P.

(57) ABSTRACT

According to one embodiment, a semiconductor device includes first, second and third electrodes, first and second semiconductor layers, a first conductive part, first and second insulating layers. The third electrode includes first and second portions. The first portion is between the first electrode and the second electrode. The first semiconductor layer includes first, second, third, fourth and fifth partial regions. The third partial region is between the first and second partial regions. The fourth partial region is between the first and third partial regions. The fifth partial region is between the third and second partial regions. The second semiconductor layer includes first and second semiconductor regions. The first conductive part is electrically connected to the first electrode. The first insulating layer includes a first insulating portion. The second insulating layer includes first and second insulating regions.

19 Claims, 6 Drawing Sheets

(51) Int. Cl.
*H01L 29/20* (2006.01)
*H01L 29/205* (2006.01)
*H01L 29/423* (2006.01)
*H01L 29/45* (2006.01)

(52) U.S. Cl.
CPC .... *H01L 29/4236* (2013.01); *H01L 29/42364* (2013.01); *H01L 29/42376* (2013.01); *H01L 29/452* (2013.01); *H01L 29/66462* (2013.01)

(58) Field of Classification Search
CPC ............ H01L 29/42376; H01L 29/452; H01L 29/66462
USPC .................................................. 257/76, 192
See application file for complete search history.

(56) References Cited

U.S. PATENT DOCUMENTS

| | | |
|---|---|---|
| 2012/0267637 A1 | 10/2012 | Jeon et al. |
| 2015/0194483 A1 | 7/2015 | Kajitani et al. |
| 2017/0069747 A1 | 3/2017 | Saito et al. |
| 2019/0288081 A1 | 9/2019 | Shindome et al. |
| 2020/0357736 A1* | 11/2020 | Akutsu ............... H01L 23/5222 |

FOREIGN PATENT DOCUMENTS

| | | |
|---|---|---|
| JP | 2015-179786 A | 10/2015 |
| JP | 2017-50434 A | 3/2017 |
| JP | 6268366 B2 | 1/2018 |
| JP | 2019-161001 A | 9/2019 |

\* cited by examiner

SEMICONDUCTOR DEVICE WITH SUPPRESSED SELF-TURN-ON

CROSS-REFERENCE TO RELATED APPLICATIONS

This application is based upon and claims the benefit of priority from Japanese Patent Application No. 2019-095931, filed on May 22, 2019; the entire contents of which are incorporated herein by reference.

FIELD

Embodiments described herein relate generally to a semiconductor device.

BACKGROUND

Stable operations of a semiconductor device are desirable.

DETAILED DESCRIPTION

Figure 1A:
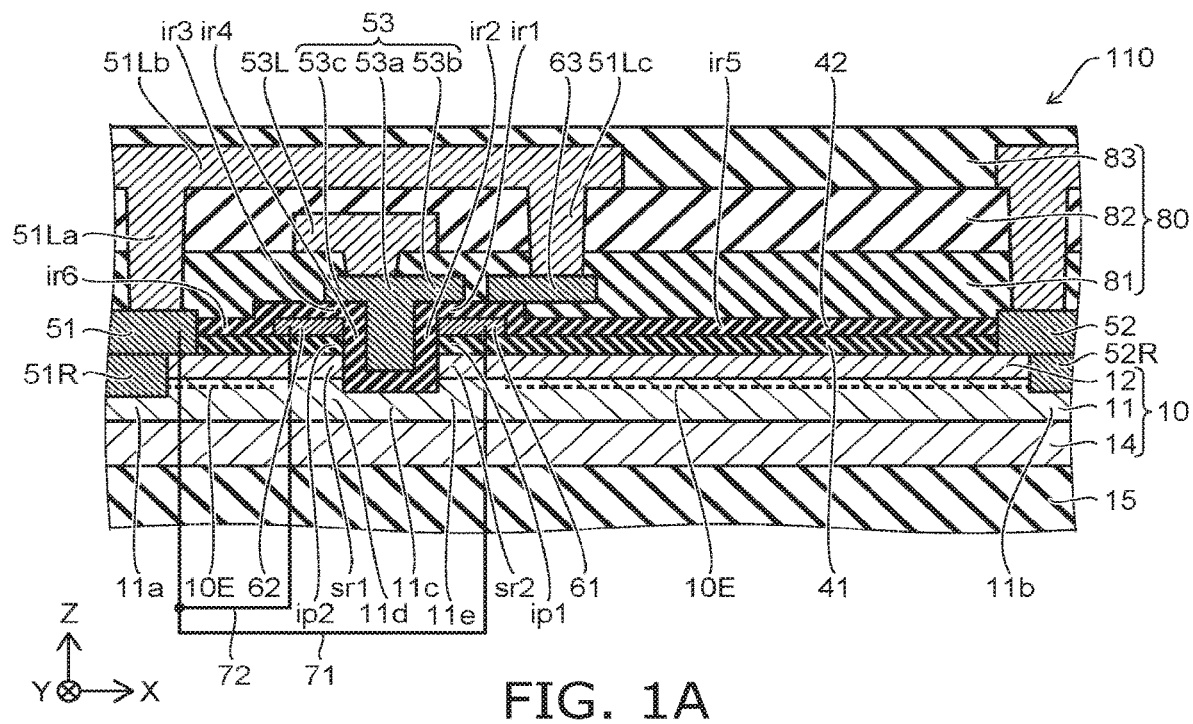
FIG. 1A and FIG. 1B are schematic cross-sectional views illustrating a semiconductor device according to a first embodiment.

According to one embodiment, a semiconductor device includes a first electrode, a second electrode, a third electrode, a first semiconductor layer, a second semiconductor layer, a first conductive part, a first insulating layer, and a second insulating layer. The third electrode includes a first portion and a second portion. The second portion is continuous with the first portion. A position of the first portion in a first direction is between a position of the first electrode in the first direction and a position of the second electrode in the first direction. The first direction is from the first electrode toward the second electrode. A position of the second portion in the first direction is between the position of the first portion in the first direction and the position of the second electrode in the first direction. The first semiconductor layer includes $Al_{x1}Ga_{1-x1}N$ ($0 \le x1 < 1$). The first semiconductor layer includes a first partial region, a second partial region, a third partial region, a fourth partial region, and a fifth partial region. A second direction from the first partial region toward the first electrode crosses the first direction. A direction from the second partial region toward the second electrode is aligned with the second direction. A direction from the third partial region toward the first portion is aligned with the second direction. The third partial region is between the first partial region and the second partial region in the first direction. The fourth partial region is between the first partial region and the third partial region in the first direction. The fifth partial region is between the third partial region and the second partial region in the first direction. The second semiconductor layer includes $Al_{x2}Ga_{1-x2}N$ ($0 < x2 \le 1$ and $x1 < x2$). The second semiconductor layer includes a first semiconductor region and a second semiconductor region. A direction from the fourth partial region toward the first semiconductor region is aligned with the second direction. A direction from the fifth partial region toward the second semiconductor region is aligned with the second direction. The first conductive part is electrically connected to the first electrode. At least a portion of the first conductive part is between the second portion and at least a portion of the second semiconductor region in the second direction. The first insulating layer includes a first insulating portion. The first insulating portion is between the at least a portion of the second semiconductor region and the at least a portion of the first conductive part in the second direction. The second insulating layer includes a first insulating region and a second insulating region. The first insulating region is between the second portion and the at least a portion of the first conductive part in the second direction. The second insulating region is between the first portion and the first conductive part in the first direction. The second semiconductor region includes an end portion opposing the second insulating region. The first conductive part includes an end portion opposing the second insulating region. A first distance along the first direction between a position in the first direction of the end portion of the second semiconductor region and a position in the first direction of the end portion of the first conductive part is shorter than a second insulating region thickness along the first direction of the second insulating region.

According to another embodiment, a semiconductor device includes a first electrode, a second electrode, a third electrode, a first semiconductor layer, a second semiconductor layer, a first conductive part, a second conductive part, a first insulating layer, and a second insulating layer. The third electrode includes a first portion, a second portion, and a third portion. The second portion is continuous with the first portion. The third portion is continuous with the first portion. A position of the first portion in a first direction is between a position of the first electrode in the first direction and a position of the second electrode in the first direction. The first direction is from the first electrode toward the second electrode. A position of the second portion in the first direction is between the position of the first portion in the first direction and the position of the second electrode in the first direction. A position of the third portion in the first direction is between the position of the first electrode in the first direction and the position of the first portion in the first direction. The first semiconductor layer includes $Al_{x1}Ga_{1-x1}N$ ($0 \le x1 < 1$). The first semiconductor layer includes a first partial region, a second partial region, a third partial region, a fourth partial region, and a fifth partial region. A second direction from the first partial region toward the first electrode crosses the first direction. A direction from the second partial region toward the second electrode is aligned with the second direction. A direction from the third partial region toward the first portion is aligned with the second direction. The third partial region is between the first partial region and the second partial region in the first direction. The fourth partial region is between the first partial region and the third partial region in the first direction. The fifth partial region is between the third partial region and the second partial region in the first direction. The second semiconductor layer includes $Al_{x2}Ga_{1-x2}N$ ($0 < x2 \le 1$ and $x1 < x2$). The second semiconductor layer includes a first semiconductor region and a second semiconductor region. A direction from the fourth partial region toward the first semiconductor region is aligned with the second direction. A direction from the fifth partial region toward the second semiconductor region is aligned with the second direction. The first conductive part is electrically connected to the first electrode. At least a portion of the first conductive part is between the second portion and at least a portion of the second semiconductor region in the second direction. The second conductive part is electrically connected to the first electrode. At least a portion of the second conductive part is between the third portion and at least a portion of the first semiconductor region in the second direction. The first insulating layer includes a first insulating portion and a second insulating portion. The first insulating portion is between the at least a portion of the second semiconductor region and the at least a portion of the first conductive part in the second direction. The second insulating portion is between the at least a portion of the first semiconductor region and the at least a portion of the second conductive part in the second direction. The second insulating layer includes a first insulating region, a second insulating region, a third insulating region, and a fourth insulating region. The first insulating region is between the second portion and the at least a portion of the first conductive part in the second direction. The second insulating region is between the first portion and the first conductive part in the first direction. The third insulating region is between the third portion and the at least a portion of the second conductive part in the second direction. The fourth insulating region is between the first portion and the second conductive part in the first direction.

According to another embodiment, a semiconductor device includes a first electrode, a second electrode, a third electrode, a first semiconductor layer, a second semiconductor layer, a first conductive part, a first insulating layer, and a second insulating layer. The third electrode includes a first portion and a second portion. The second portion is continuous with the first portion. A position of the first portion in a first direction is between a position of the first electrode in the first direction and a position of the second electrode in the first direction. The first direction is from the first electrode toward the second electrode. A position of the second portion in the first direction is between the position of the first portion in the first direction and the position of the second electrode in the first direction. The first semiconductor layer includes $Al_{x1}Ga_{1-x1}N$ ($0 \leq x1 < 1$). The first semiconductor layer includes a first partial region, a second partial region, a third partial region, a fourth partial region, and a fifth partial region. A second direction from the first partial region toward the first electrode crosses the first direction. A direction from the second partial region toward the second electrode is aligned with the second direction. A direction from the third partial region toward the first portion is aligned with the second direction. The third partial region is between the first partial region and the second partial region in the first direction. The fourth partial region is between the first partial region and the third partial region in the first direction. The fifth partial region is between the third partial region and the second partial region in the first direction. The second semiconductor layer includes $Al_{x2}Ga_{1-x2}N$ ($0 < x2 \leq 1$ and $x1 < x2$). The second semiconductor layer includes a first semiconductor region and a second semiconductor region. A direction from the fourth partial region toward the first semiconductor region is aligned with the second direction. A direction from the fifth partial region toward the second semiconductor region is aligned with the second direction. The first conductive part is electrically connected to the first electrode. At least a portion of the first conductive part is between the second portion and at least a portion of the second semiconductor region in the second direction. The first insulating layer includes a first insulating portion. The first insulating portion is between the at least a portion of the second semiconductor region and the at least a portion of the first conductive part in the second direction. The second insulating layer includes a first insulating region and a second insulating region. The first insulating region is between the second portion and the at least a portion of the first conductive part in the second direction. The second insulating region is between the first portion and the first conductive part in the first direction. The first conductive part includes a first conductive portion, a second conductive portion, and a third conductive portion. The second conductive portion is between the first insulating portion and the first conductive portion in the second direction. A direction from the third conductive portion toward the first conductive portion is aligned with the first direction. A distance along the second direction between the second conductive portion and the first semiconductor layer is shorter than a distance along the second direction between the third conductive portion and the first semiconductor layer.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
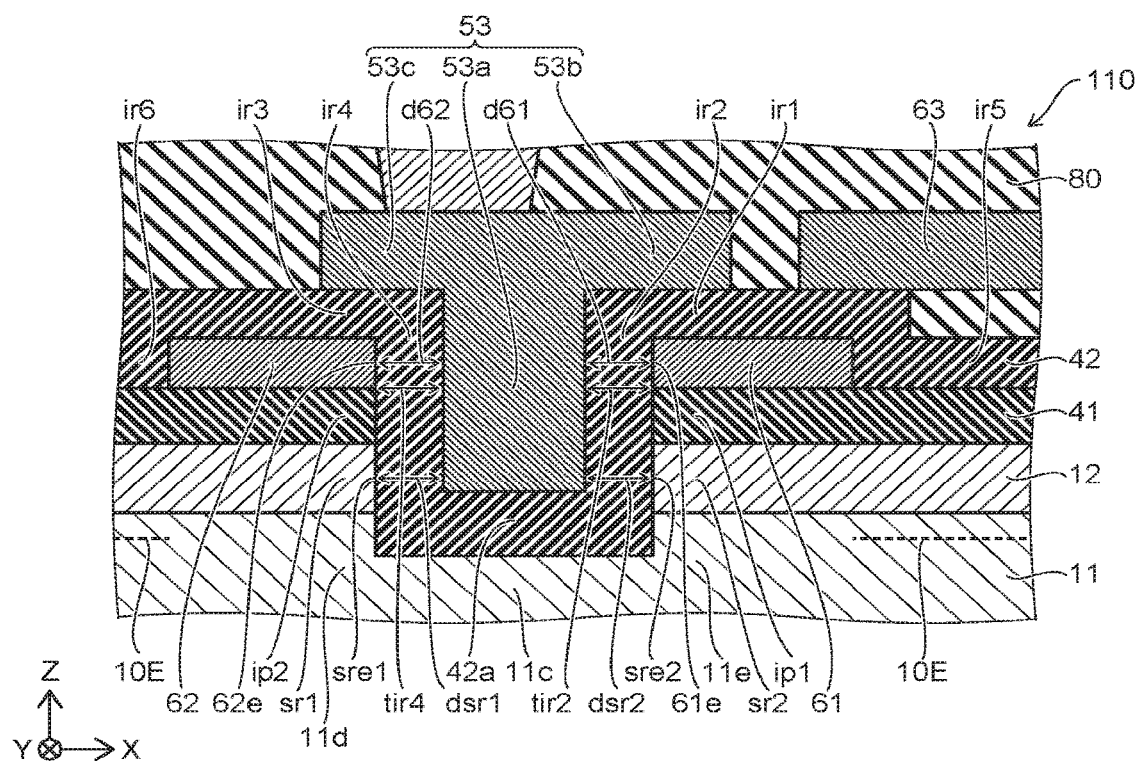

FIG. 1A and FIG. 1B are schematic cross-sectional views illustrating a semiconductor device according to a first embodiment.

FIG. 1B shows an enlarged portion of FIG. 1A.

As shown in FIG. 1A, the semiconductor device 110 according to the embodiment includes a first electrode 51, a second electrode 52, a third electrode 53, a first semiconductor layer 11, a second semiconductor layer 12, a first conductive part 61, a first insulating layer 41, and a second insulating layer 42.

A first direction from the first electrode 51 toward the second electrode 52 is taken as an X-axis direction. A direction perpendicular to the X-axis direction is taken as a Z-axis direction. A direction perpendicular to the X-axis direction and the Z-axis direction is taken as a Y-axis direction.

In one example, the first to third electrodes 51 to 53 extend along the Y-axis direction.

The third electrode 53 includes a first portion 53a and a second portion 53b. The second portion 53b is continuous with the first portion 53a. The position of the first portion 53a in the first direction (e.g., the X-axis direction) is between the position of the first electrode 51 in the first direction and the position of the second electrode 52 in the first direction. The position of the second portion 53b in the first direction is between the position of the first portion 53a in the first direction and the position of the second electrode 52 in the first direction.

The second portion 53b is, for example, one protruding portion of the third electrode 53. The protruding portion protrudes from the first portion 53a toward the second electrode 52.

The first semiconductor layer 11 includes $Al_{x1}Ga_{1-x1}N$ ($0 \leq x1 < 1$). In one example, the first semiconductor layer 11 is GaN.

The first semiconductor layer 11 includes a first partial region 11a, a second partial region 11b, a third partial region 11c, a fourth partial region 11d, and a fifth partial region 11e. A second direction from the first partial region 11a toward the first electrode 51 crosses the first direction. The second direction is, for example, the Z-axis direction.

The direction from the second partial region 11b toward the second electrode 52 is aligned with the second direction (e.g., the Z-axis direction). The direction from the third partial region 11c toward the first portion 53a is aligned with the second direction (e.g., the Z-axis direction). The third partial region 11c is between the first partial region 11a and the second partial region 11b in the first direction (the X-axis direction). The fourth partial region 11d is between the first partial region 11a and the third partial region 11c in the first direction (the X-axis direction). The fifth partial region 11e is between the third partial region 11c and the second partial region 11b in the first direction (the X-axis direction). The first to fifth partial regions 11a to 11e are continuous with each other.

The second semiconductor layer 12 includes $Al_{x2}Ga_{1-x2}N$ ($0 < x2 \leq 1$ and $x1 < x2$).

As shown in FIG. 1B, the second semiconductor layer 12 includes a first semiconductor region sr1 and a second semiconductor region sr2. The direction from the fourth partial region 11d toward the first semiconductor region sr1 is aligned with the second direction (e.g., the Z-axis direction). The direction from the fifth partial region 11e toward the second semiconductor region sr2 is aligned with the second direction (e.g., the Z-axis direction).

As shown in FIG. 1A, the first conductive part 61 is electrically connected to the first electrode 51. In the example as shown in FIG. 1A, the first conductive part 61 is electrically connected to the first electrode 51 by an interconnect 71 (e.g., the conductive member). The interconnect 71 may not be at a position in the cross section illustrated in FIG. 1A and may be provided at another position. FIG. 1A illustrates the connectional relationship of the interconnect 71; and the spatial position of the interconnect 71 may be different from that of FIG. 1A.

As shown in FIG. 1B, at least a portion of the first conductive part 61 is between the second portion 53b and at least a portion of the second semiconductor region sr2 in the second direction (e.g., the Z-axis direction).

As shown in FIG. 1B, the first insulating layer 41 includes a first insulating portion ip1. The first insulating portion ip1 is between the at least a portion of the second semiconductor region sr2 recited above and the at least a portion of the first conductive part 61 recited above in the second direction (e.g., the Z-axis direction).

As shown in FIG. 1B, the second insulating layer 42 includes a first insulating region ir1 and a second insulating region ir2. The first insulating region ir1 is between the second portion 53b and the at least a portion of the first conductive part 61 recited above in the second direction (e.g., the Z-axis direction). The second insulating region ir2 is between the first portion 53a and the first conductive part 61 in the first direction (the X-axis direction). For example, the second insulating region ir2 is between the first portion 53a and the first insulating portion ip1 in the first direction.

For example, the second insulating region ir2 is between the first portion 53a and the second semiconductor region sr2 in the first direction.

As shown in FIG. 1A, the first electrode 51 is electrically connected to the first partial region 11a. The second electrode 52 is electrically connected to the second partial region 11b. In the example, a first contact region 51R is provided between the first electrode 51 and the first partial region 11a. A second contact region 52R is provided between the second electrode 52 and the second partial region 11b. The impurity concentration in the first contact region 51R is higher than the impurity concentration in the first partial region 11a. The impurity concentration in the second contact region 52R is higher than the impurity concentration in the second partial region 11b. The impurity is, for example, silicon, etc. These contact regions may be provided as necessary and may be omitted.

A base body 15 and an intermediate layer 14 are provided in the example. The base body 15 is, for example, a silicon substrate. The first semiconductor layer 11 is provided between the base body 15 and the second semiconductor layer 12. The intermediate layer 14 is provided between the base body 15 and the first semiconductor layer 11. The intermediate layer 14 is, for example, a buffer layer. The intermediate layer 14 includes, for example, multiple stacked AlGaN layers (including an AlN layer or a GaN layer), etc. For example, the first semiconductor layer 11 and the second semiconductor layer 12 are included in a semiconductor member 10. The intermediate layer 14 may be included in the semiconductor member 10.

The distance along the X-axis direction between the first electrode 51 and the third electrode 53 is shorter than the distance along the X-axis direction between the third electrode 53 and the second electrode 52.

The first electrode 51 is, for example, a source electrode. The second electrode 52 is, for example, a drain electrode. The third electrode 53 is, for example, a gate electrode. The current that flows between the first electrode 51 and the second electrode 52 can be controlled by the voltage applied to the third electrode 53.

As shown in FIG. 1A and FIG. 1B, for example, a carrier region 10E is formed in a region of the first semiconductor layer 11 proximal to the second semiconductor layer 12. The carrier region 10E is, for example, a two-dimensional electron gas. The semiconductor device 110 is, for example, a HEMT (High Electron Mobility Transistor).

The carrier region 10E is substantially electrically connected to the second electrode 52 in the region between the third electrode 53 and the second electrode 52. A large electrical capacitance is formed between the carrier region 10E and the second portion 53b (the protruding portion) of the third electrode 53. As a result, for example, the ratio (Cgd/Cgs) of a gate-drain capacitance Cgd to a gate-source capacitance Cgs is high. In such a case, self-turn-on occurs easily.

In the embodiment, the first conductive part 61 which is electrically connected to the first electrode 51 is provided. The first conductive part 61 which is connected to the first electrode 51 (e.g., the source electrode) exists between the third electrode 53 (e.g., the gate electrode) and the carrier region 10E connected to the second electrode 52 (e.g., the drain electrode). Therefore, the electric field is shielded; and, for example, the electrical capacitance (e.g., the gate-drain capacitance Cgd) between the third electrode 53 and the second electrode 52 can be small. For example, the ratio (Cgd/Cgs) can be reduced. Thereby, for example, the selfturn-on can be suppressed. According to the embodiment, a semiconductor device can be provided in which stable operations can be obtained.

In the embodiment as shown in FIG. 1B, the position (the position in the X-axis direction) of the end of the first conductive part 61 on the second insulating region ir2 side is substantially the same as the position (the position in the X-axis direction) of the end of the second semiconductor region sr2 on the second insulating region ir2 side. For example, the first conductive part 61 contacts the second insulating region ir2. The second semiconductor region sr2 contacts the second insulating region ir2. Therefore, the region where the generation of the carrier region 10E is suppressed contacts the second insulating region ir2. For example, the generation of a carrier region in the region contacting the second insulating region ir2 is suppressed by a small drain voltage. The carrier region 10E can be suppressed reliably in the regions proximal to the third electrode 53.

On the other hand, a first reference example may be considered in which the second semiconductor region sr2 contacts the second insulating region ir2, and the first conductive part 61 is separated from the second insulating region ir2. In the first reference example, the carrier region 10E is generated in the region where the first conductive part 61 is separated from the second insulating region ir2. Therefore, the suppression of the carrier region 10E is insufficient. It is difficult to set the ratio (Cgd/Cgs) to be sufficiently low.

A second reference example may be considered in which the second semiconductor region sr2 contacts the first portion 53a of the third electrode 53, and an insulating layer is provided between the first conductive part 61 and the first portion 53a. In the second reference example as well, the carrier region 10E is generated in the region between the first conductive part 61 and the first portion 53a. Therefore, the suppression of the carrier region 10E is insufficient. As a result, it is difficult to set the ratio (Cgd/Cgs) to be sufficiently low.

In the embodiment, for example, the position of the end of the first conductive part 61 on the second insulating region ir2 side is substantially the same as the position of the end of the second semiconductor region sr2 on the second insulating region ir2 side. Thereby, the carrier region 10E can be suppressed reliably at the vicinity of the third electrode 53. The ratio (Cgd/Cgs) reliably can be low. For example, the self-turn-on can be suppressed. Stable operations are obtained.

For example, as shown in FIG. 1B, the second semiconductor region sr2 includes an end portion sre2 opposing the second insulating region ir2. The first conductive part 61 includes an end portion 61e opposing the second insulating region ir2. The position in the first direction (the X-axis direction) of the end portion sre2 is substantially the same as the position in the first direction of the end portion 61e. In the example shown in FIG. 1B, the distance in the first direction between these positions is substantially 0.

Figure 2:
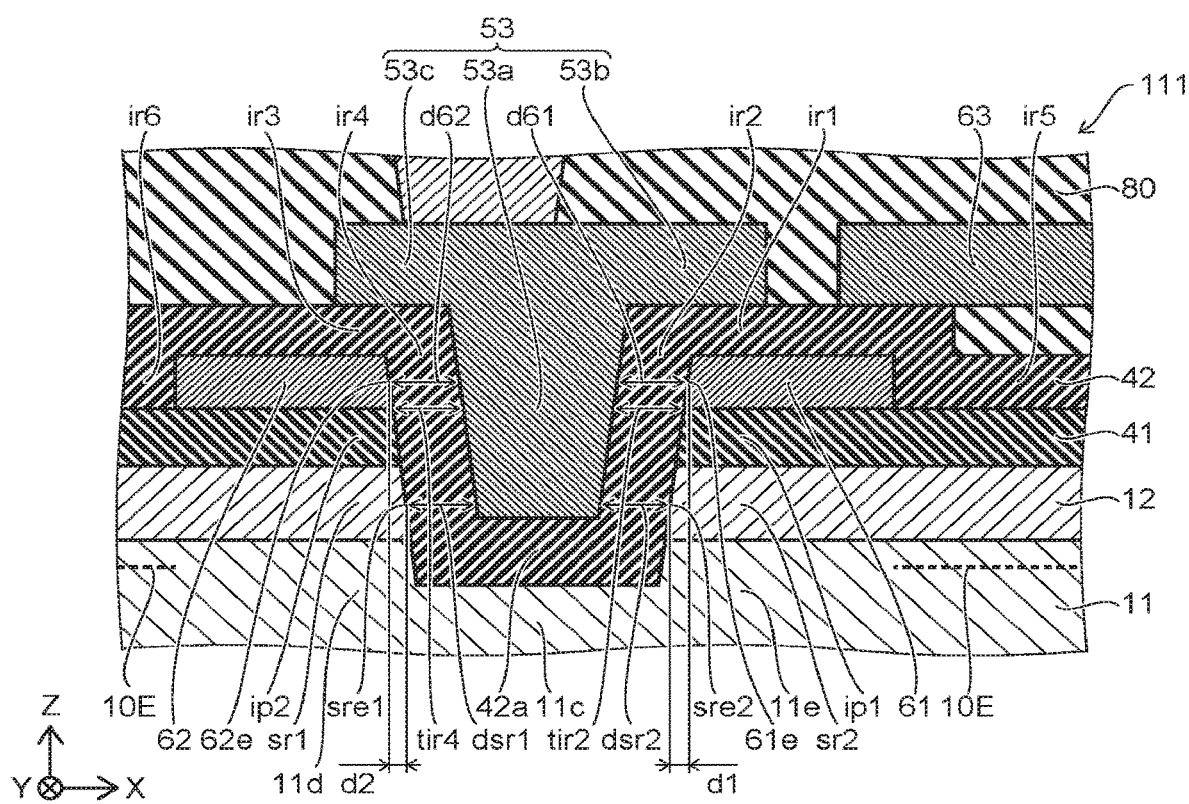
FIG. 2 is a schematic cross-sectional view illustrating a semiconductor device according to the first embodiment.

FIG. 2 is a schematic cross-sectional view illustrating a semiconductor device according to the first embodiment.

In the semiconductor device 111 according to the embodiment as shown in FIG. 2, the side surface of the first portion 53a of the third electrode 53 is oblique to the X-Y plane. Otherwise, the configuration of the semiconductor device 111 is similar to that of the semiconductor device 110.

As described below, for example, the third electrode 53 is formed by forming a recess (e.g., a trench) in the semiconductor member 10 including the first semiconductor layer 11 and the second semiconductor layer 12, and by forming an insulating film and a conductive member in the trench. The semiconductor device 111 is formed when the side surface of the recess is oblique. The semiconductor device 110 is formed when the side surface of the recess is substantially perpendicular to the X-Y plane.

The position in the first direction (the X-axis direction) of the end portion sre2 may be shifted from the position in the first direction of the end portion 61e according to the oblique of the side surface of the recess. The shift amount is extremely small and practically can be ignored.

As shown in FIG. 2, for example, the distance along the first direction between the position in the first direction (the X-axis direction) of the end portion sre2 of the second semiconductor region sr2 and the position in the first direction of the end portion 61e of the first conductive part 61 is taken as a first distance d1. For example, the first distance d1 is shorter than a second insulating region thickness tir2 along the first direction (the X-axis direction) of the second insulating region ir2. The carrier region 10E can be suppressed practically thereby. The ratio (Cgd/Cgs) can be reduced practically. Stable operations are obtained practically.

For example, it is favorable for the first distance d1 to be not more than ½ of the second insulating region thickness tir2. The carrier region 10E can be suppressed more reliably thereby. The ratio (Cgd/Cgs) can be reduced more reliably.

In the example (the semiconductor device 110) shown in FIG. 1B, the first distance d1 is 0.

As shown in FIG. 1B and FIG. 2, the distance along the first direction between the first portion 53a and the second semiconductor region sr2 is taken as a distance dsr2. The distance along the first direction between the first portion 53a and the first conductive part 61 is taken as a distance d61. The distance dsr2 is substantially equal to the distance d61. For example, it is favorable for the difference between the distance dsr2 and the distance d61 to be not more than ½ of the second insulating region thickness tir2. The difference may be not more than ¼ of the second insulating region thickness tir2.

As shown in FIG. 1A and FIG. 1B, the semiconductor device 110 further includes a second conductive part 62. The second conductive part 62 is electrically connected to the first electrode 51. In the example as shown in FIG. 1A, the second conductive part 62 is electrically connected to the first electrode 51 by an interconnect 72 (e.g., the conductive member). The interconnect 72 may not be at a position in the cross section illustrated in FIG. 1A and may be provided at another position. FIG. 1A illustrates the connectional relationship of the interconnect 72; and the spatial position of the interconnect 72 may be different from that of FIG. 1A.

As shown in FIG. 1B and FIG. 2, the third electrode 53 further includes a third portion 53c. The third portion 53c is continuous with the first portion 53a. The position of the third portion 53c in the first direction (the X-axis direction) is between the position of the first electrode 51 in the first direction and the position of the first portion 53a in the first direction. The position in the X-axis direction of the first portion 53a is between the position in the X-axis direction of the third portion 53c and the position in the X-axis direction of the second portion 53b.

The third portion 53c is, for example, another protruding portion of the third electrode 53. The protruding portion protrudes from the first portion 53a toward the first electrode 51.

As shown in FIG. 1B and FIG. 2, at least a portion of the second conductive part 62 is between the third portion 53c and at least a portion of the first semiconductor region sr1 in the second direction (e.g., the Z-axis direction). At least a portion of the second conductive part 62 overlaps the third portion 53c and at least a portion of the first semiconductor region sr1 in the second direction (e.g., the Z-axis direction).

The first insulating layer 41 includes a second insulating portion ip2. The second insulating portion ip2 is between the at least a portion of the first semiconductor region sr1 recited above and the at least a portion of the second conductive part 62 recited above in the second direction (e.g., the Z-axis direction).

The second insulating layer 42 includes a third insulating region ir3 and a fourth insulating region ir4. The third insulating region ir3 is between the third portion 53c and the at least a portion of the second conductive part 62 recited above in the second direction (e.g., the Z-axis direction).

The fourth insulating region ir4 is between the first portion 53a and the second conductive part 62 in the first direction (the X-axis direction). For example, the fourth insulating region ir4 is between the first portion 53a and the second insulating portion ip2 in the first direction. For example, the fourth insulating region ir4 is between the first portion 53a and the first semiconductor region sr1 in the first direction.

For example, the gate-source capacitance Cgs increases due to the second conductive part 62. For example, the ratio (Cgd/Cgs) can be reduced. The self-turn-on can be suppressed.

As shown in FIG. 1B and FIG. 2, the first semiconductor region sr1 includes an end portion sre1 opposing the fourth insulating region ir4. The second conductive part 62 includes an end portion 62e opposing the fourth insulating region ir4. The distance along the first direction between the position in the first direction (the X-axis direction) of the end portion sre1 of the first semiconductor region sr1 and the position in the first direction of the end portion 62e of the second conductive part 62 is taken as a second distance d2. The second distance d2 may be, for example, substantially 0. For example, the second distance d2 is shorter than a fourth insulating region thickness tir4 along the first direction of the fourth insulating region ir4.

For example, the carrier region 10E is suppressed easily in the region (the region proximal to the third electrode 53) between the first electrode 51 and the third electrode 53.

For example, it is favorable for the second distance d2 to be not more than ½ of the fourth insulating region thickness tir4. The carrier region 10E is suppressed easily.

For example, the distance along the first direction (the X-axis direction) between the first portion 53a and the first semiconductor region sr1 is taken as a distance dsr1. The distance along the first direction between the first portion 53a and the second conductive part 62 is taken as a distance d62. The distance dsr1 is substantially equal to the distance d62. For example, it is favorable for the difference between the distance dsr1 and the distance d62 to be not more than ½ of the fourth insulating region thickness tir4. The difference may be not more than ¼ of the fourth insulating region thickness tir4. The carrier region 10E is suppressed easily.

As shown in FIG. 1B and FIG. 2, the second insulating layer 42 includes a portion 42a. The portion 42a is provided between the third partial region 11c and the first portion 53a. For example, the portion 42a of the second insulating layer 42 functions as a gate insulating film. Thereby, for example, the threshold voltage can be high. For example, a normally-off operation is obtained stably.

The portion 42a of the second insulating layer 42 may oppose the first semiconductor layer 11 in the first direction (the X-axis direction). The direction from a portion of the first portion 53a of the third electrode 53 toward the second semiconductor layer 12 is aligned with the first direction (the X-axis direction). The direction from a portion of the first portion 53a toward a portion of the first semiconductor layer 11 may be aligned with the first direction.

The second insulating layer 42 may include a fifth insulating region ir5 and a sixth insulating region ir6. The first conductive part 61 is between the second insulating region ir2 and the fifth insulating region ir5 in the first direction (the X-axis direction). The second conductive part 62 is between the fourth insulating region ir4 and the sixth insulating region ir6 in the first direction (the X-axis direction). The first insulating portion ip1 of the first insulating layer 41 is between the second semiconductor region sr2 and the fifth insulating region ir5 in the second direction (the Z-axis direction). The second insulating portion ip2 of the first insulating layer 41 is between the first semiconductor region sr1 and the sixth insulating region ir6 in the second direction.

The first insulating layer 41 includes, for example, silicon and nitrogen. The second insulating layer 42 includes, for example, silicon and oxygen. The concentration of nitrogen in the first insulating layer 41 is higher than the concentration of nitrogen in the second insulating layer 42. The concentration of oxygen in the second insulating layer 42 is higher than the concentration of oxygen in the first insulating layer 41.

As shown in FIG. 1A and FIG. 2, the semiconductor devices 110 and 111 may include a third conductive part 63. The third conductive part 63 is electrically connected to the first electrode 51. Conductive members 51La to 51Lc (e.g., interconnects) are provided in the example. These conductive members are electrically connected to the first electrode 51 and the third conductive part 63. The first electrode 51 is between the first partial region 11a and the conductive member 51La in the second direction (the Z-axis direction). The third conductive part 63 is between the first semiconductor layer 11 and the conductive member 51Lc in the second direction. The conductive member 51Lb connects the conductive member 51La to the conductive member 51Lc. The third electrode 53 is between the third partial region 11c and the conductive member 51Lb in the second direction (the Z-axis direction).

A conductive member 53L (e.g., an interconnect) is provided in the example. The conductive member 53L is electrically connected to the third electrode 53. The third electrode 53 is between the first semiconductor layer 11 and at least a portion of the conductive member 53L in the Z-axis direction. The conductive member 53L is between the third electrode 53 and the conductive member 51Lb in the Z-axis direction.

For example, the position of the first conductive part 61 in the second direction (e.g., the Z-axis direction) is between the position of the first semiconductor layer 11 (e.g., the fifth partial region 11e) in the second direction and the position of the third conductive part 63 in the second direction.

The concentration of the electric field is suppressed by the third conductive part 63. For example, the third conductive part 63 functions as a field plate.

In the example, at least a portion of the first conductive part 61 is between the first semiconductor layer 11 (e.g., the fifth partial region 11e) and the third conductive part 63 in the second direction (the Z-axis direction). For example, at least a portion of the first conductive part 61 overlaps the first semiconductor layer 11 (e.g., the fifth partial region 11e) and the third conductive part 63 in the second direction (the Z-axis direction). For example, a portion of the first conductive part 61 overlaps the second portion 53b of the third electrode 53 in the Z-axis direction. For example, another portion of the first conductive part 61 overlaps the third conductive part 63 in the Z-axis direction. In the example, the direction from the second portion 53b toward the third conductive part 63 is aligned with the first direction (the X-axis direction). By such a configuration, for example, the electric field concentration at the first conductive part 61 when a high voltage is applied to the second electrode 52 (e.g., the drain electrode) can be relaxed. Thereby, for example, the breakdown voltage increases.

As shown in FIG. 1A and FIG. 2, the semiconductor devices 110 and 111 include an insulating member 80. As shown in FIG. 1A, the insulating member 80 may include first to third layer portions 81 to 83. For example, the first to third layer portions 81 to 83 are continuous with each other. The boundaries between the first to third layer portions 81 to 83 may be distinct or may be indistinct. The insulating member 80 includes at least one selected from the group consisting of silicon oxide, silicon nitride, and aluminum oxide.

For example, the second insulating layer 42 is between the first insulating layer 41 and the third layer portion 83. The first layer portion 81 is between the second insulating layer 42 and the third layer portion 83. The second layer portion 82 is between the first layer portion 81 and the third layer portion 83. For example, the second portion 53b of the third electrode 53 is between the second insulating region ir2 of the second insulating layer 42 and a portion of the first layer portion 81 in the Z-axis direction. A portion of the second layer portion 82 is between the first layer portion 81 and the conductive member 51Lb in the Z-axis direction. The conductive member 51Lb is between the second layer portion 82 and the third layer portion 83. The multiple conductive portions are insulated from each other by the insulating member 80. The conductive portions are protected by the insulating member 80.

In the semiconductor devices 110 and 111, the first conductive part 61 may be omitted; and the second conductive part 62 may be provided. In such a case, for example, the gate-source capacitance Cgs can be large. The ratio (Cgd/Cgs) can be reduced. For example, the self-turn-on can be suppressed. Stable operations are obtained.

An example of a method for manufacturing the semiconductor device 110 will now be described.

FIG. 3A to FIG. 3F are schematic cross-sectional views illustrating the method for manufacturing the semiconductor device according to the first embodiment.

The base body 15 and the intermediate layer 14 are not illustrated in these drawings.

Figure 3A:
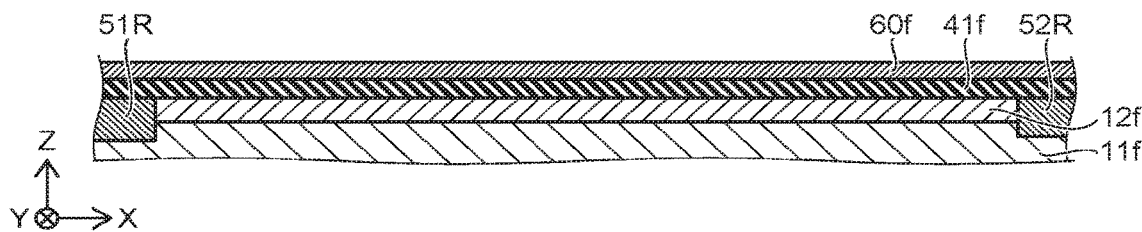
FIG. 3A to FIG. 3F are schematic cross-sectional views illustrating the method for manufacturing the semiconductor device according to the first embodiment.

As shown in FIG. 3A, a second semiconductor film 12f which is used to form the second semiconductor layer 12 is provided on a first semiconductor film 11f which is used to form the first semiconductor layer 11. The first contact region 51R and the second contact region 52R are provided in the example. An insulating film 41f which is used to form the first insulating layer 41 is formed on the second semiconductor film 12f and on these contact regions. The insulating film 41f is, for example, a SiN film. A conductive film 60f is formed on the insulating film 41f. As described below, the conductive film 60f is used to form the first conductive part 61 and the second conductive part 62.

Figure 3B:
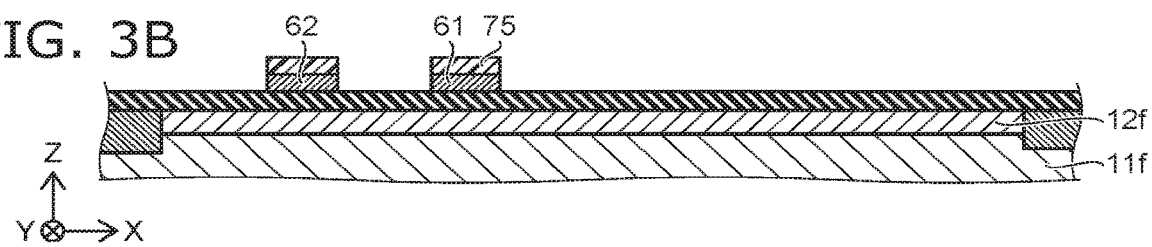

As shown in FIG. 3B, a mask layer 75 (e.g., a resist layer) which has an opening is formed on the conductive film 60f; and a portion of the conductive film 60f is removed via the opening. The first conductive part 61 and the second conductive part 62 are formed thereby.

Figure 3C:
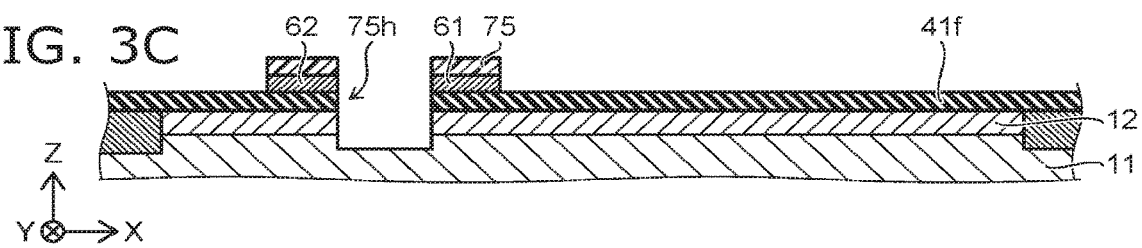

As shown in FIG. 3C, a portion of the insulating film 41f, a portion of the second semiconductor film 12f, and a portion of the first semiconductor film 11f are removed using the mask layer 75 as a mask. A hole 75h (e.g., a trench) is formed. The first semiconductor film 11f is exposed at the bottom portion of the hole 75h. The first semiconductor layer 11 and the second semiconductor layer 12 are formed.

Figure 3D:
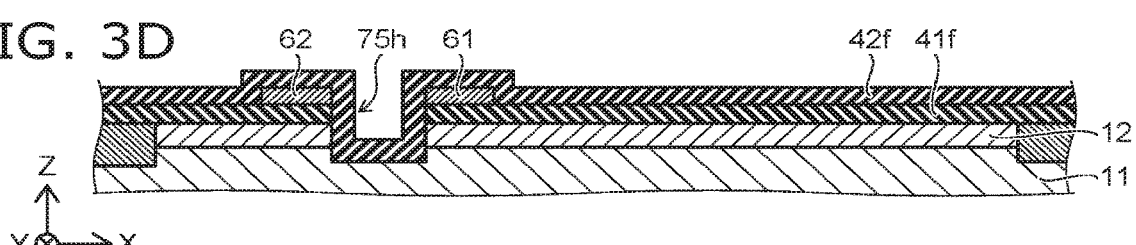

As shown in FIG. 3D, an insulating film 42f which is used to form the second insulating layer 42 is formed. The insulating film 42f is, for example, a $SiO_2$ film.

Figure 3E:
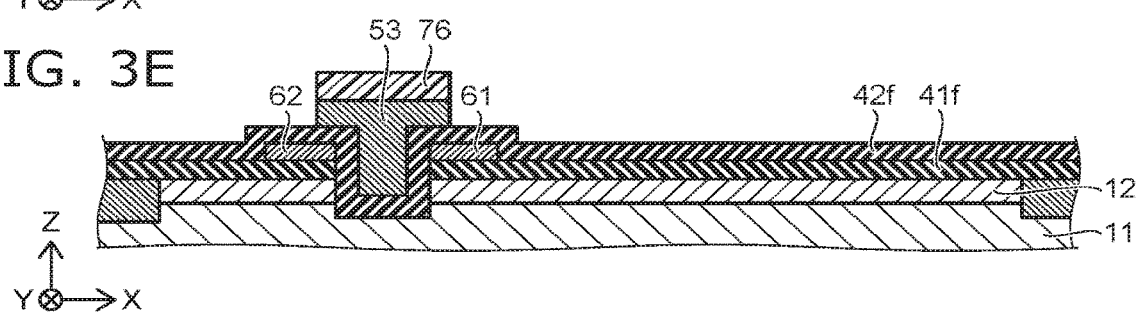

As shown in FIG. 3E, a conductive film is formed in the space remaining in the hole 75h and on the insulating film 42f; a mask layer 76 (e.g., a resist layer) which has an opening is formed on the conductive film; and the conductive film is patterned using the mask layer 76 as a mask. The third electrode 53 is formed thereby.

Figure 3F:
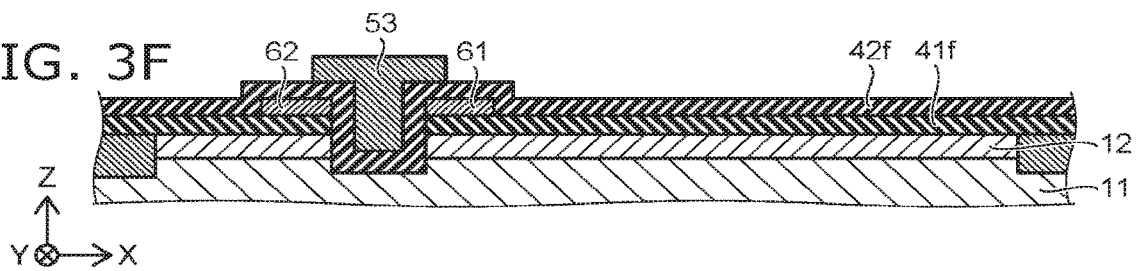

As shown in FIG. 3F, the mask layer 76 is removed. Subsequently, portions of the insulating film 41f and the insulating film 42f are removed; and the first electrode 51 and the second electrode 52 are formed. Subsequently, the semiconductor device 110 is formed by forming the insulating member 80, the third conductive part 63, etc.

The semiconductor device 111 can be formed by causing the side surface of the hole 75h to be oblique when forming the hole 75h recited above.

In the manufacturing method recited above, the third electrode 53 is formed after forming the first conductive part 61 (and the second conductive part 62). Heat treatment is performed to stabilize the characteristics of the third electrode 53. It is favorable for the characteristics of the first conductive part 61 (and the second conductive part 62) not to degrade easily due to the heat treatment.

For example, it is favorable for at least one of the first conductive part 61 or the second conductive part 62 to include at least one selected from the group consisting of polysilicon, WN, and TiN. The heat resistance is high for these materials. The degradation due to the heat treatment can be suppressed.

For example, it is favorable for the third electrode 53 to include at least one selected from the group consisting of Ti, W, WN, and TiN. The heat resistance is high for these materials. Stable characteristics are obtained easily.

For example, it is favorable for the conductive member 53L (referring to FIG. 1A) to include at least one selected from the group consisting of Al, Cu, TiN, and Ti. A low electrical resistance is obtained.

For example, it is favorable for the third conductive part 63 (referring to FIG. 1A) to include at least one selected from the group consisting of Al, Cu, TiN, and Ti. A low electrical resistance is obtained.

It is favorable for the conductive members 51La to 51Lc (referring to FIG. 1A) to include at least one selected from the group consisting of Cu, Al, TiN, and Ti. A low electrical resistance is obtained.

For example, it is favorable for the first electrode 51 and the second electrode 52 (referring to FIG. 1A) to include at least one selected from the group consisting of Al and Ti. Thereby, for example, the contact resistance can be low.

Figure 4:
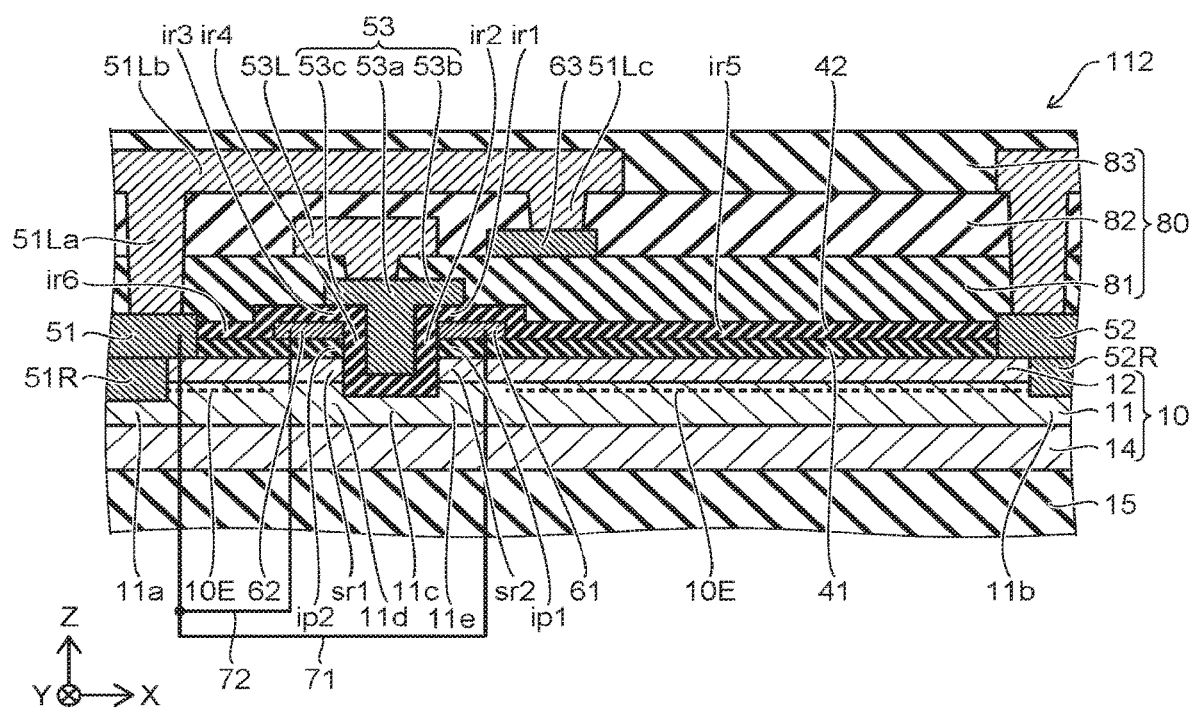
FIG. 4 is a schematic cross-sectional view illustrating a semiconductor device according to the first embodiment.

FIG. 4 is a schematic cross-sectional view illustrating a semiconductor device according to the first embodiment.

As shown in FIG. 4, the position in the Z-axis direction of the third conductive part 63 in the semiconductor device 112 according to the embodiment is different from that of the semiconductor device 110. Otherwise, the configuration of the semiconductor device 112 is similar to that of the semiconductor device 110.

In the semiconductor device 112, the position of the second portion 53b in the second direction (the Z-axis direction) is between the position of the first semiconductor layer 11 (e.g., the fifth partial region 11e) in the second direction and the position of the third conductive part 63 in the second direction. For example, the direction from the conductive member 53L toward the third conductive part 63 is aligned with the first direction (the X-axis direction). Thus, the position of the third conductive part 63 can be modified.

In the semiconductor device 112 as well, the ratio (Cgd/Cgs) can be reduced. For example, the self-turn-on can be suppressed. Stable operations are obtained. In the semiconductor device 112, the side surface of the third electrode 53 may be oblique to the X-Y plane.

Second Embodiment

Figure 5A:
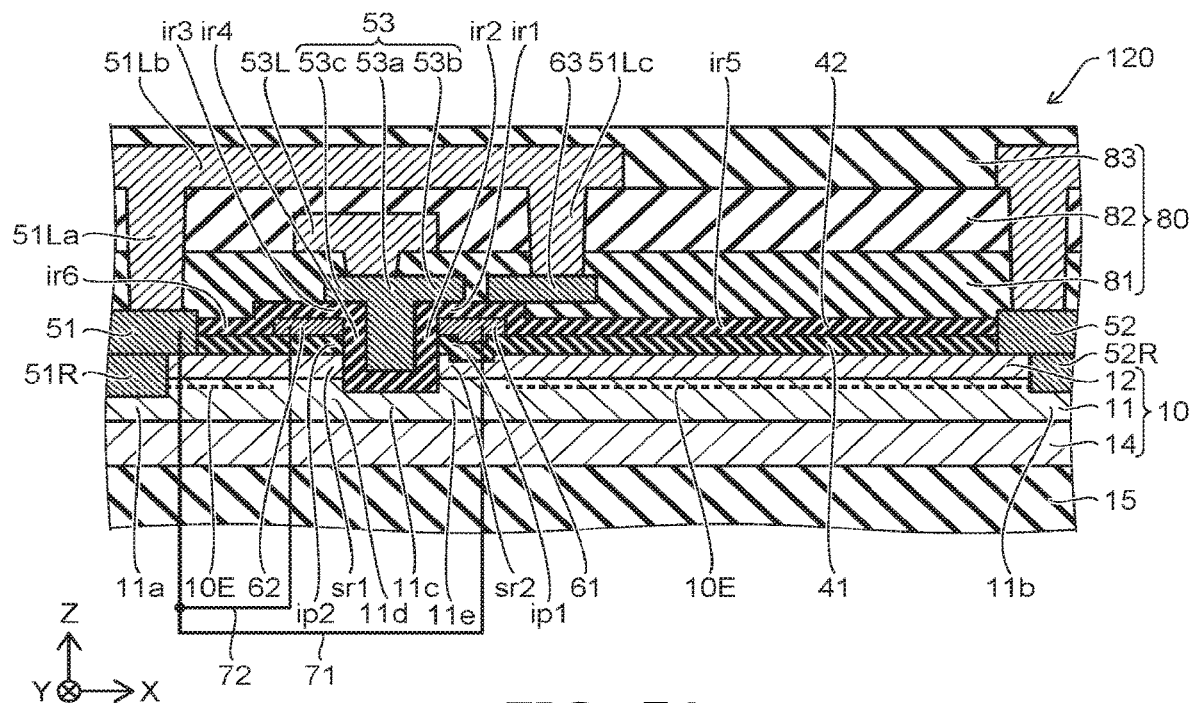
FIG. 5A and FIG. 5B are schematic cross-sectional views illustrating a semiconductor device according to a second embodiment.
Figure 5B:
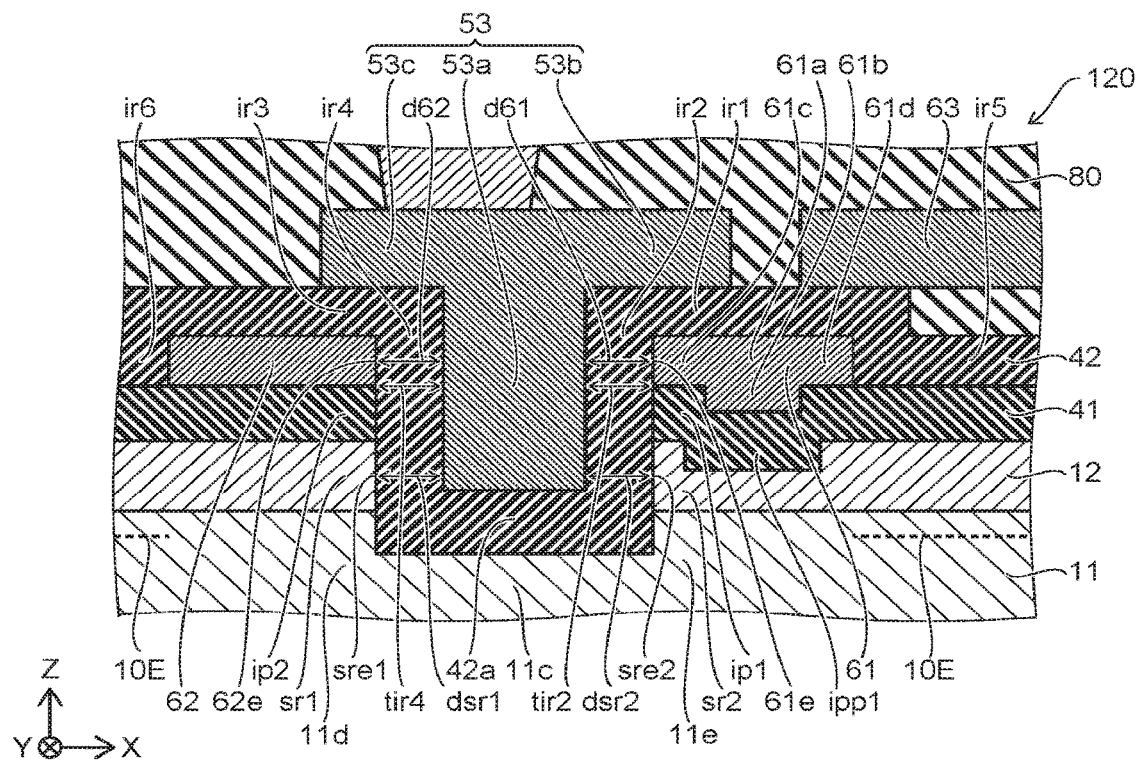

FIG. 5A and FIG. 5B are schematic cross-sectional views illustrating a semiconductor device according to a second embodiment.

FIG. 5B shows an enlarged portion of FIG. 5A.

As shown in FIG. 5A, the semiconductor device 120 according to the embodiment includes the first electrode 51, the second electrode 52, the third electrode 53, the first semiconductor layer 11, the second semiconductor layer 12, the first conductive part 61, the first insulating layer 41, and the second insulating layer 42. The configuration of the first conductive part 61 in the semiconductor device 120 is different from that of the semiconductor device 110. Otherwise, the configuration of the semiconductor device 120 is similar to that of the semiconductor device 110.

In the semiconductor device 120 as shown in FIG. 5B, the first conductive part 61 includes a first conductive portion 61a, a second conductive portion 61b, and a third conductive portion 61c. The second conductive portion 61b is between the first insulating portion ip1 and the first conductive portion 61a in the second direction (e.g., the Z-axis direction). The direction from the third conductive portion 61c toward the first conductive portion 61a is aligned with the first direction (the X-axis direction).

The distance along the second direction (e.g., the Z-axis direction) between the second conductive portion 61b and the first semiconductor layer 11 (e.g., the fifth partial region 11e) is shorter than the distance along the second direction (e.g., the Z-axis direction) between the third conductive portion 61c and the first semiconductor layer 11 (e.g., the fifth partial region 11e).

The second conductive portion 61b is a protrusion of the first conductive part 61. The protrusion protrudes from the other portions toward the first semiconductor layer 11.

Due to such a first conductive part 61, the ratio (Cgd/Cgs) can be lower. For example, the self-turn-on can be suppressed further. Stable operations are obtained.

In the example as shown in FIG. 5B, the first conductive part 61 further includes a fourth conductive portion 61d. The first conductive portion 61a is between the third conductive portion 61c and the fourth conductive portion 61d in the first direction (the X-axis direction). The position in the first direction (the X-axis direction) of the second conductive portion 61b is between the position in the first direction of the third conductive portion 61c and the position in the first direction of the fourth conductive portion 61d. The distance along the second direction (the Z-axis direction) between the second conductive portion 61b and the first semiconductor layer 11 (e.g., the fifth partial region 11e) is shorter than the distance along the second direction between the fourth conductive portion 61d and the first semiconductor layer 11 (e.g., the fifth partial region 11e). For example, it is easy to form the protrusion (the second conductive portion 61b) of the first conductive part 61 in a stable configuration. For example, the ratio (Cgd/Cgs) can be reduced stably. For example, the self-turn-on can be suppressed stably. Stable operations are easier to obtain.

In the example, the second insulating layer 42 includes the fifth insulating region ir5 (referring to FIG. 5B). The first conductive portion 61a is between the second insulating region ir2 and the fifth insulating region ir5 in the first direction (the X-axis direction). The second conductive portion 61b opposes the first insulating layer 41 in the first direction. For example, the protrusion (the second conductive portion 61b) is buried in the first insulating layer 41.

The first insulating portion ip1 opposes the second conductive portion 61b in the second direction (the Z-axis direction). A portion ipp1 of the first insulating portion ip1 opposes a portion of the second semiconductor layer 12 in the first direction (the X-axis direction). The portion ipp1 of the first insulating portion ip1 is a protrusion of the first insulating layer 41 in the downward direction.

For example, such a configuration is obtained by forming a recess (e.g., a trench) in the first insulating layer 41 and by forming the conductive film 60f used to form the first conductive part 61 (e.g., referring to FIG. 3A) in the recess and on the first insulating layer 41.

Figure 6:
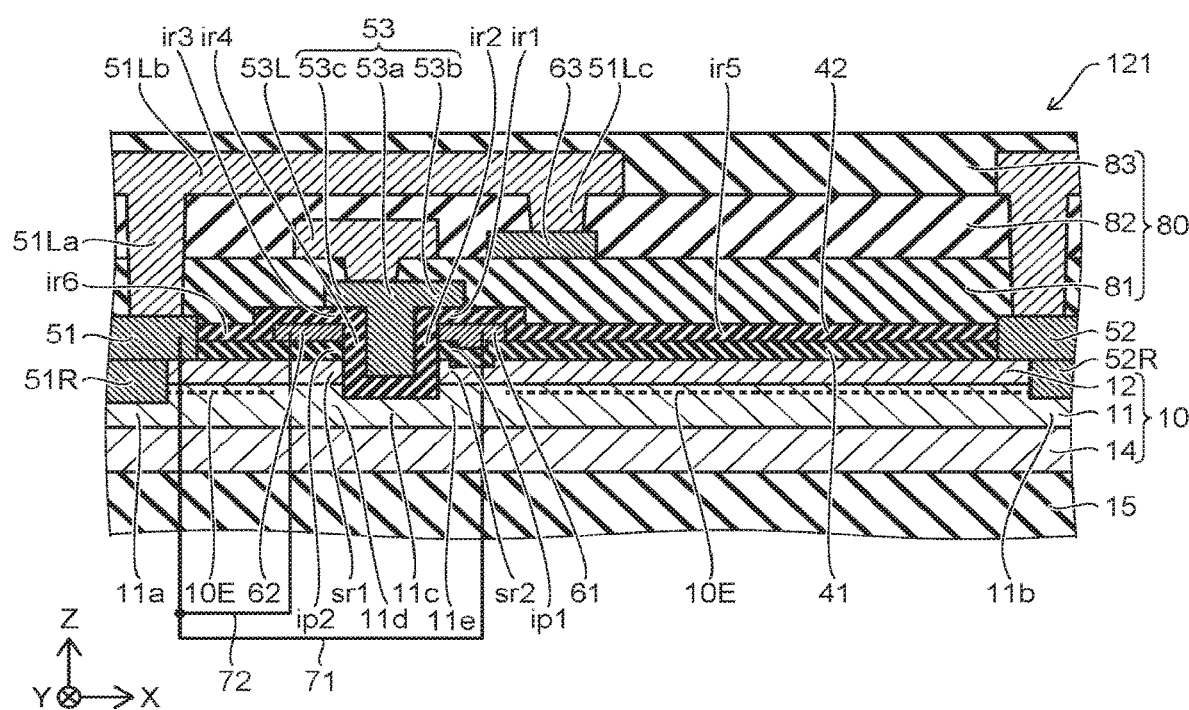
FIG. 6 is a schematic cross-sectional view illustrating a semiconductor device according to the second embodiment.

FIG. 6 is a schematic cross-sectional view illustrating a semiconductor device according to the second embodiment.

In the semiconductor device 121 according to the embodiment as shown in FIG. 6, the position in the Z-axis direction of the third conductive part 63 is different from that of the semiconductor device 120. Otherwise, the configuration of the semiconductor device 121 is similar to that of the semiconductor device 120.

In the semiconductor device 121, the position of the second portion 53b in the second direction (the Z-axis direction) is between the position of the first semiconductor layer 11 (e.g., the fifth partial region 11e) in the second direction and the position of the third conductive part 63 in the second direction. For example, the direction from the conductive member 53L toward the third conductive part 63 is aligned with the first direction (the X-axis direction). Thus, the position of the third conductive part 63 can be modified.

In the semiconductor device 121 as well, the ratio (Cgd/Cgs) can be reduced. For example, the self-turn-on can be suppressed. Stable operations are obtained.

In the semiconductor devices 120 and 121, the side surface of the third electrode 53 may be oblique to the X-Y plane.

The second conductive part 62 is provided in the semiconductor devices 120 and 121. The second conductive part 62 may be omitted from the semiconductor devices 120 and 121.

According to the embodiment, a semiconductor device can be provided in which stable operations can be obtained.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor layers, electrodes, conductive parts, insulating layers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first electrode;
   a second electrode;
   a third electrode including a first portion and a second portion, the second portion being continuous with the first portion, a position of the first portion in a first direction being between a position of the first electrode in the first direction and a position of the second electrode in the first direction, the first direction being from the first electrode toward the second electrode, a position of the second portion in the first direction being between the position of the first portion in the first direction and the position of the second electrode in the first direction;
   a first semiconductor layer including $Al_{x1}Ga_{1-x1}N$ ($0 \leq x1 < 1$), the first semiconductor layer including a first partial region, a second partial region, a third partial region, a fourth partial region, and a fifth partial region, a second direction from the first partial region toward the first electrode crossing the first direction, a direction from the second partial region toward the second electrode being in parallel with the second direction, a direction from the third partial region toward the first portion being in parallel with the second direction, the third partial region being between the first partial region and the second partial region in the first direction, the fourth partial region being between the first partial region and the third partial region in the first direction, the fifth partial region being between the third partial region and the second partial region in the first direction;
   a second semiconductor layer including $Al_{x2}Ga_{1-x2}N$ ($0 < x2 \leq 1$ and $x1 < x2$), the second semiconductor layer including a first semiconductor region and a second semiconductor region, a direction from the fourth partial region toward the first semiconductor region being in parallel with the second direction, a direction from the fifth partial region toward the second semiconductor region being in parallel with the second direction;
   a first conductive part electrically connected to the first electrode, at least a portion of the first conductive part being between the second portion and at least a portion of the second semiconductor region in the second direction;
   a first insulating layer including a first insulating portion, the first insulating portion being between the at least a portion of the second semiconductor region and the at least a portion of the first conductive part in the second direction; and
   a second insulating layer including a first insulating region and a second insulating region, the first insulating region being between the second portion and the at least a portion of the first conductive part in the second direction, the second insulating region being between the first portion and the first conductive part in the first direction,
   the second semiconductor region including an end portion opposing the second insulating region,
   the first conductive part including an end portion opposing the second insulating region,
   a first distance along the first direction between a position in the first direction of the end portion of the second semiconductor region and a position in the first direction of the end portion of the first conductive part being shorter than a second insulating region thickness along the first direction of the second insulating region.

2. The device according to claim 1, wherein the first distance is not more than ½ of the second insulating region thickness.

3. The device according to claim 1, wherein a difference between a distance along the first direction between the first portion and the second semiconductor region and a distance along the first direction between the first portion and the first conductive part is not more than ½ of the second insulating region thickness.

4. The device according to claim 1, further comprising a second conductive part electrically connected to the first electrode,
   the third electrode further including a third portion continuous with the first portion,
   a position of the third portion in the first direction being between the position of the first electrode in the first direction and the position of the first portion in the first direction,
   at least a portion of the second conductive part being between the third portion and at least a portion of the first semiconductor region in the second direction,
   the first insulating layer including a second insulating portion, the second insulating portion being between the at least a portion of the first semiconductor region and the at least a portion of the second conductive part in the second direction,
the second insulating layer including a third insulating region and a fourth insulating region,
the third insulating region being between the third portion and the at least a portion of the second conductive part in the second direction,
the fourth insulating region being between the first portion and the second conductive part in the first direction.

5. The device according to claim 4, wherein
the first semiconductor region includes an end portion opposing the fourth insulating region,
the second conductive part includes an end portion opposing the fourth insulating region, and
a second distance along the first direction between a position in the first direction of the end portion of the first semiconductor region and a position in the first direction of the end portion of the second conductive part is shorter than a fourth insulating region thickness along the first direction of the fourth insulating region.

6. The device according to claim 5, wherein the second distance is not more than ½ of the fourth insulating region thickness.

7. The device according to claim 5, wherein a difference between a distance along the first direction between the first portion and the first semiconductor region and a distance along the first direction between the first portion and the second conductive part is not more than ½ of the fourth insulating region thickness.

8. The device according to claim 1, wherein
the first conductive part includes a first conductive portion, a second conductive portion, and a third conductive portion,
the second conductive portion is between the first insulating portion and the first conductive portion in the second direction,
a direction from the third conductive portion toward the first conductive portion is in parallel with the first direction, and
a distance along the second direction between the second conductive portion and the first semiconductor layer is shorter than a distance along the second direction between the third conductive portion and the first semiconductor layer.

9. The device according to claim 8, wherein
the first conductive part further includes a fourth conductive portion,
the first conductive portion is between the third conductive portion and the fourth conductive portion in the first direction,
a position in the first direction of the second conductive portion is between a position in the first direction of the third conductive portion and a position in the first direction of the fourth conductive portion, and
the distance along the second direction between the second conductive portion and the first semiconductor layer is shorter than a distance along the second direction between the fourth conductive portion and the first semiconductor layer.

10. The device according to claim 8, wherein
the second insulating layer further includes a fifth insulating region,
the first conductive portion is between the second insulating region and the fifth insulating region in the first direction, and
the second conductive portion opposes the first insulating layer in the first direction.

11. The device according to claim 8, wherein
the first insulating portion opposes the second conductive portion in the second direction, and
a portion of the first insulating portion opposes a portion of the second semiconductor layer in the first direction.

12. The device according to claim 1, wherein the first conductive part includes at least one selected from the group consisting of polysilicon, WN, and TiN.

13. The device according to claim 1, wherein the second insulating layer further includes a portion provided between the third partial region and the first portion.

14. The device according to claim 1, wherein
the first electrode is electrically connected to the first partial region, and
the second electrode is electrically connected to the second partial region.

15. A semiconductor device, comprising:
a first electrode;
a second electrode;
a third electrode, the third electrode including a first portion, a second portion, and a third portion, the second portion being continuous with the first portion, the third portion being continuous with the first portion, a position of the first portion in a first direction being between a position of the first electrode in the first direction and a position of the second electrode in the first direction, the first direction being from the first electrode toward the second electrode, a position of the second portion in the first direction being between the position of the first portion in the first direction and the position of the second electrode in the first direction, a position of the third portion in the first direction being between the position of the first electrode in the first direction and the position of the first portion in the first direction;
a first semiconductor layer including $Al_{x1}Ga_{1-x1}N$ ($0 \le x1 < 1$), the first semiconductor layer including a first partial region, a second partial region, a third partial region, a fourth partial region, and a fifth partial region, a second direction from the first partial region toward the first electrode crossing the first direction, a direction from the second partial region toward the second electrode being in parallel with the second direction, a direction from the third partial region toward the first portion being in parallel with the second direction, the third partial region being between the first partial region and the second partial region in the first direction, the fourth partial region being between the first partial region and the third partial region in the first direction, the fifth partial region being between the third partial region and the second partial region in the first direction;
a second semiconductor layer including $Al_{x2}Ga_{1-x2}N$ ($0 < x2 \le 1$ and $x1 < x2$), the second semiconductor layer including a first semiconductor region and a second semiconductor region, a direction from the fourth partial region toward the first semiconductor region being in parallel with the second direction, a direction from the fifth partial region toward the second semiconductor region being in parallel with the second direction;
a first conductive part electrically connected to the first electrode, at least a portion of the first conductive part being between the second portion and at least a portion of the second semiconductor region in the second direction;

a second conductive part electrically connected to the first electrode, at least a portion of the second conductive part being between the third portion and at least a portion of the first semiconductor region in the second direction;

a first insulating layer including a first insulating portion and a second insulating portion, the first insulating portion being between the at least a portion of the second semiconductor region and the at least a portion of the first conductive part in the second direction, the second insulating portion being between the at least a portion of the first semiconductor region and the at least a portion of the second conductive part in the second direction; and a second insulating layer including a first insulating region, a second insulating region, a third insulating region, and a fourth insulating region, the first insulating region being between the second portion and the at least a portion of the first conductive part in the second direction, the second insulating region being between the first portion and the first conductive part in the first direction, the third insulating region being between the third portion and the at least a portion of the second conductive part in the second direction, the fourth insulating region being between the first portion and the second conductive part in the first direction.

16. A semiconductor device, comprising:
a first electrode;
a second electrode;
a third electrode including a first portion and a second portion, the second portion being continuous with the first portion, a position of the first portion in a first direction being between a position of the first electrode in the first direction and a position of the second electrode in the first direction, the first direction being from the first electrode toward the second electrode, a position of the second portion in the first direction being between position of the first portion in the first direction and the position of the second electrode in the first direction;

a first semiconductor layer including $Al_{x1}Ga_{1-x1}N$ ($0 \leq x1 < 1$), the first semiconductor layer including a first partial region, a second partial region, a third partial region, a fourth partial region, and a fifth partial region, a second direction from the first partial region toward the first electrode crossing the first direction, a direction from the second partial region toward the second electrode being in parallel with the second direction, a direction from the third partial region toward the first portion being in parallel with the second direction, the third partial region being between the first partial region and the second partial region in the first direction, the fourth partial region being between the first partial region and the third partial region in the first direction, the fifth partial region being between the third partial region and the second partial region in the first direction;

a second semiconductor layer including $Al_{x2}Ga_{1-x2}N$ ($0 < x2 \leq 1$ and $x1 < x2$), the second semiconductor layer including a first semiconductor region and a second semiconductor region, a direction from the fourth partial region toward the first semiconductor region being in parallel with the second direction, a direction from the fifth partial region toward the second semiconductor region being in parallel with the second direction;

a first conductive part electrically connected to the first electrode, at least a portion of the first conductive part being between the second portion and at least a portion of the second semiconductor region in the second direction;

a first insulating layer including a first insulating portion, the first insulating portion being between the at least a portion of the second semiconductor region and the at least a portion of the first conductive part in the second direction; and a second insulating layer including a first insulating region and a second insulating region, the first insulating region being between the second portion and the at least a portion of the first conductive part in the second direction, the second insulating region being between the first portion and the first conductive part in the first direction, the first conductive part including a first conductive portion, a second conductive portion, and a third conductive portion, the second conductive portion being between the first insulating portion and the first conductive portion in the second direction, a direction from the third conductive portion toward the first conductive portion being in parallel with the first direction, a distance along the second direction between the second conductive portion and the first semiconductor layer being shorter than a distance along the second direction between the third conductive portion and the first semiconductor layer.

17. The device according to claim 16, further comprising a third conductive part electrically connected to the first electrode,
a position of the first conductive part in the second direction being between a position of the first semiconductor layer in the second direction and a position of the third conductive part in the second direction.

18. The device according to claim 17, wherein a direction from the second portion toward the third conductive part is in parallel with the first direction.

19. The device according to claim 17, wherein a position of the second portion in the second direction is between the position of the first semiconductor layer in the second direction and a conductive member, wherein the conductive member is directly connected to the third conductive part.

* * * * *